United States Patent
Wang et al.

(10) Patent No.: US 7,773,645 B2
(45) Date of Patent: Aug. 10, 2010

(54) UNCOOLED EXTERNAL CAVITY LASER OPERATING OVER AN EXTENDED TEMPERATURE RANGE

(75) Inventors: Peidong Wang, Carlisle, MA (US); Daryoosh Vakhshoori, Cambridge, MA (US); Masud Azimi, Belmont, MA (US); Kevin J. Knopp, Newburyport, MA (US)

(73) Assignee: Ahura Scientific Inc., Wilmington, MA (US)

( * ) Notice: Subject to any disclaimer, the term of this patent is extended or adjusted under 35 U.S.C. 154(b) by 0 days.

(21) Appl. No.: 11/593,966

(22) Filed: Nov. 7, 2006

(65) Prior Publication Data

US 2007/0116069 A1 May 24, 2007

Related U.S. Application Data

(60) Provisional application No. 60/734,570, filed on Nov. 8, 2005.

(51) Int. Cl.
*H01S 3/04* (2006.01)
(52) U.S. Cl. ....................................... 372/34
(58) Field of Classification Search .................... 372/34
See application file for complete search history.

(56) References Cited

U.S. PATENT DOCUMENTS

| | | | |
|---|---|---|---|
| 3,017,513 A | 1/1962 | Messelt | |
| 3,906,241 A | 9/1975 | Thompson | |
| 4,930,872 A | 6/1990 | Convery | |
| 5,026,160 A | 6/1991 | Dorain et al. | |
| 5,048,959 A | 9/1991 | Morris et al. | |
| 5,260,639 A * | 11/1993 | De Young et al. | 322/2 R |
| 5,377,004 A | 12/1994 | Owen et al. | |
| 5,483,337 A | 1/1996 | Barnard et al. | |
| 5,550,375 A | 8/1996 | Peters et al. | |
| 5,615,673 A | 4/1997 | Berger et al. | |
| 5,651,018 A | 7/1997 | Mehuys et al. | |
| 5,659,566 A | 8/1997 | Takemoto | |
| 5,734,165 A | 3/1998 | Unal et al. | |
| 5,828,450 A | 10/1998 | Dou et al. | |
| 5,850,623 A | 12/1998 | Carman, Jr. et al. | |
| 6,002,476 A | 12/1999 | Treado | |
| 6,018,535 A * | 1/2000 | Maeda | 372/20 |
| 6,038,363 A | 3/2000 | Slater et al. | |

(Continued)

FOREIGN PATENT DOCUMENTS

WO    2006/080939    8/2006

OTHER PUBLICATIONS

Eckenrode et al., "Portable Raman Spectroscopy Systems for Field Analysis" Forensic Science Communications, 3(4), (2001).

(Continued)

*Primary Examiner*—Minsun Harvey
*Assistant Examiner*—Michael Carter
(74) *Attorney, Agent, or Firm*—Fish & Richardson P.C.

(57) ABSTRACT

A laser package comprising a semiconductor laser having an operating temperature range and a heater, wherein the heater is configured to heat the laser when the laser package is positioned in an environment having an ambient temperature which lies outside of the operating temperature range of the laser, so that the laser will remain within the operating temperature range.

24 Claims, 10 Drawing Sheets

U.S. PATENT DOCUMENTS

| | | | |
|---|---|---|---|
| 6,045,502 | A | 4/2000 | Eppstein et al. |
| 6,069,689 | A | 5/2000 | Zeng et al. |
| 6,082,724 | A | 7/2000 | Kahlig et al. |
| 6,249,349 | B1 | 6/2001 | Lauer |
| 6,303,934 | B1 | 10/2001 | Daly et al. |
| 6,373,567 | B1 | 4/2002 | Wise et al. |
| 6,510,257 | B1 | 1/2003 | Barwicz et al. |
| 6,526,071 | B1 | 2/2003 | Zorabedian et al. |
| 6,608,677 | B1 | 8/2003 | Ray et al. |
| 6,612,559 | B2 | 9/2003 | Boss |
| 6,625,182 | B1 | 9/2003 | Kuksenkov et al. |
| 6,636,304 | B2 | 10/2003 | Gilby |
| 6,636,536 | B1* | 10/2003 | Tisue .......................... 372/20 |
| 6,707,548 | B2 | 3/2004 | Kreimer et al. |
| 6,771,369 | B2 | 8/2004 | Rzasa et al. |
| 6,803,328 | B2 | 10/2004 | McCullough |
| 6,862,092 | B1 | 3/2005 | Ibsen et al. |
| 6,879,621 | B2 | 4/2005 | Heck et al. |
| 6,907,149 | B2 | 6/2005 | Slater |
| 6,919,959 | B2 | 7/2005 | Masten |
| 6,959,248 | B2 | 10/2005 | Gard et al. |
| 6,977,723 | B2 | 12/2005 | Lemmo et al. |
| 6,992,759 | B2 | 1/2006 | Nakayama et al. |
| 7,092,090 | B2 | 8/2006 | Shimizu et al. |
| 7,110,109 | B2 | 9/2006 | Knopp et al. |
| 7,289,208 | B2 | 10/2007 | Vakhshoori et al. |
| 2002/0015433 | A1* | 2/2002 | Zimmermann ............... 372/96 |
| 2002/0033944 | A1 | 3/2002 | Sharts et al. |
| 2002/0085598 | A1 | 7/2002 | Shaw |
| 2002/0101019 | A1 | 8/2002 | Boss |
| 2002/0154301 | A1 | 10/2002 | Shen et al. |
| 2003/0002548 | A1 | 1/2003 | Boscha |
| 2003/0002839 | A1 | 1/2003 | Clow et al. |
| 2003/0030800 | A1 | 2/2003 | Golden et al. |
| 2003/0085348 | A1 | 5/2003 | Megerle |
| 2003/0142302 | A1 | 7/2003 | Jiang |
| 2003/0147593 | A1 | 8/2003 | Slater |
| 2003/0179472 | A1 | 9/2003 | Schaefer et al. |
| 2003/0197860 | A1 | 10/2003 | Rice |
| 2003/0219046 | A1* | 11/2003 | Kitaoka et al. ................. 372/32 |
| 2003/0227628 | A1 | 12/2003 | Kreimer et al. |
| 2004/0039274 | A1 | 2/2004 | Benaron et al. |
| 2004/0058386 | A1 | 3/2004 | Wishart et al. |
| 2004/0109230 | A1 | 6/2004 | Matsushita et al. |
| 2004/0130714 | A1 | 7/2004 | Gellerman et al. |
| 2004/0165183 | A1 | 8/2004 | Marquardt et al. |
| 2004/0165254 | A1 | 8/2004 | Tokura et al. |
| 2004/0190679 | A1 | 9/2004 | Waggener et al. |
| 2004/0217383 | A1 | 11/2004 | Krames et al. |
| 2004/0252299 | A9 | 12/2004 | Lemmo et al. |
| 2004/0263843 | A1 | 12/2004 | Knopp et al. |
| 2005/0006590 | A1 | 1/2005 | Harrison |
| 2005/0018721 | A1* | 1/2005 | Kish et al. ..................... 372/20 |
| 2005/0083521 | A1 | 4/2005 | Kamerman |
| 2005/0248759 | A1 | 11/2005 | Wang et al. |
| 2006/0023209 | A1 | 2/2006 | Lee et al. |
| 2006/0045147 | A1* | 3/2006 | Sin et al. ...................... 372/20 |
| 2006/0045151 | A1 | 3/2006 | Vakhshoori et al. |
| 2006/0088069 | A1 | 4/2006 | Vakhshoori et al. |
| 2006/0170917 | A1 | 8/2006 | Vakhshoori et al. |
| 2006/0203862 | A1* | 9/2006 | Bonen et al. ................... 372/34 |
| 2007/0002319 | A1 | 1/2007 | Knopp et al. |
| 2007/0024848 | A1 | 2/2007 | Knopp et al. |
| 2008/0002746 | A1* | 1/2008 | Narayan ...................... 372/34 |
| 2008/0033663 | A1 | 2/2008 | Brown et al. |
| 2008/0170223 | A1 | 7/2008 | Vakhshoori et al. |
| 2009/0033928 | A1 | 2/2009 | Azimi et al. |

OTHER PUBLICATIONS

Harvey et al., "Blind field test evaluation of Raman spectroscopy as a forensic tool" Forensic Science International, 125:12-21, (2002).

Moore, "Instrumentation for trace detection of high explosives" Review of Scientific Instruments, 75(8):75(8):2499-2512, (2004).

Cleij et al., "Reproducibility as the Basis of a Similarity Index for Continuous Variables in Straightforward Library Search Methods," Analytica Chimica Acta, vol. 150:29-36 (1983).

http://en.wikipedia.org/wiki/Coefficient of thermal expansion, downloaded on Oct. 16, 2008.

Li et al., "Comparison of Spectra Using a Bayesian Approach. An Argument using Oil Spills as an Example," Analytical Chemistry, vol. 77:639-644 (2005).

Lowry, "Automated Spectral Searching in Infrared, Raman and Near-Infrared Spectroscopy," J. Wiley & Sons Ltd., pp. 1948-1961 (2002).

*McGraw-Hill Dictionary of Scientific and Technical Terms*, Sixth Edition, McGraw Hill, New York, 2003, p. 421.

*Physics for Scientists and Engineers with Modern Physics: Fourth Edition*, Raymond A. Serway, Saunders, Saunders College Publishing, Philadelphia, 1996, pp. 536-539.

Stauffer et al., "Probability-Based Matching Algorithm with Forward Searching Capabilities for Matching Unknown Mass Spectra of Mixtures," *Analytical Chemistry*, vol. 57:1056-1060 (1985).

Jamieson, T.H., "Athermalization of optical instruments from the optomechanical viewpoint", in *Critical Review*, Optomechanical Design, ed., P.R. Yoder, Jr., vol. CR43, pp. 131-159 (Jul. 1992).

Smith, W.J., "How to Lay Out a System", in *Practical Optical System Layout*, McGraw-Hill, pp. 129-151 (1997).

Yoder, Jr., P.R., "Mounting Lenses in Optical Instruments", The International Society for Optical Engineering, vol. TT 21, pp. 69-73 (1995).

Perry, John H., "Chemical Engineers' Handbook", McGraw-Hill, pp. 12-40, 23-10, 23-11, and 23-31-23-47 (1963).

Golub, Marcia A., "Non-final Office Action", U.S. Appl. No. 11/119,076, Sep. 6, 2007 (5 pages).

Fish & Richardson P.C., "Response to Restriction Requirement", U.S. Appl. No. 11/119,076, Jan. 15, 2008 (2 pages).

Fish & Richardson P.C., "Amendment" Appl. No. U.S. 11/119,076, Jan. 15, 2008 (11 pages).

Golub, Marcia A., "Non-final Office Action", U.S. Appl. No. 11/119,076, Mar. 11, 2008 (8 pages).

Fish & Richardson P.C., "Amendment in Reply to Action of Mar. 11, 2008", U.S. Appl. No. 11/119,076, Jun. 11, 2008 (14 pages).

Golub, Marcia A., "Final Office Action" U.S. Appl. No. 11/119,076, Jul. 16, 2008 (8 pages).

Fish & Richardson P.C., "Amendment in Reply to Action of Jul. 16, 2008", U.S. Appl. No. 11/119,076, Oct. 16, 2008 (18 pages).

Golub, Marcia A., "Final Office Action", U.S. Appl. No. 11/119,076, Jan. 30, 2009 (8 pages).

Fish & Richardson P.C., "Amendment in Reply to Action of Jan. 30, 2009", U.S. Appl. No. 11/119,076, Jun. 10, 2009 (20 pages).

Golub, Marcia A. "Final Office Action", U.S. Appl. No. 11/119,076, Jun. 24, 2009 (9 pages).

Harvey, MinSun, "Notification of Transmittal of the International Search Report and the Written Opinion of the International Searching Authority, or the Declaration", International Application No. PCT/US05/15474, mailed on Aug. 12, 2008 (11 pages).

\* cited by examiner

TYPICAL LITTROW EXTERNAL CAVITY
GRATING STABILIZED CONFIGURATION

FIG. 7

THERMAL EXPANSION MISMATCH OF LASER, LENS, AND GRATING SUB-MOUNT CHANGES THE RETRO-DIFRACTION ANGLE AND COMPENSATE THERMAL EXPANSION OF GRATING PITCH

FIG. 8

USING SHALLOW ANGLE WEDGE TO
ATTACH LENS TO A PLATFORM

FIG. 9

SIDE MOUNTED BROAD AREA LASER WITH
PROPER SUB-MOUNT MATERIAL TO REDUCE
TEMPERATURE SENSITIVITY

UNCOOLED EXTERNAL CAVITY LASER OPERATING OVER AN EXTENDED TEMPERATURE RANGE

REFERENCE TO PENDING PRIOR PATENT APPLICATION

This patent application claims benefit of pending prior U.S. Provisional Patent Application Ser. No. 60/734,570, filed Nov. 8, 2005 by Peidong Wang et al. for UNCOOLED EXTERNAL CAVITY LASERS OPERATING OVER AN EXTENDED TEMPERATURE RANGE, which patent application is hereby incorporated herein by reference.

FIELD OF THE INVENTION

This invention relates to lasers in general, and more particularly to semiconductor lasers.

BACKGROUND OF THE INVENTION

Applications using Raman scattering to identify unknown materials are rapidly proliferating, e.g., in the areas of security and safety, biotechnology, biomedicine, industrial process control, pharmaceuticals, etc. This is largely due to the rich and detailed optical signatures made possible by Raman scattering.

In a Raman analyzer, a laser is used to generate a stable and narrow linewidth light signal which functions as the Raman pump. The Raman pump is directed at the specimen, resulting in Raman scattering, which provides a unique Raman signature for the specimen. The specimen's Raman signature can then be used to determine the composition of the specimen.

For portable Raman applications, small size and low electrical power consumption are essential. In this latter regard, it should be appreciated that the laser in a Raman analyzer typically accounts for the majority of the device's power consumption. Hence, in portable Raman units, the laser tends to dominate the battery lifetime of the unit.

Semiconductor lasers are one of the most efficient lasers known. Semiconductor lasers can have wall-plug efficiencies of greater than 50%, which is rare for other types of lasers. However, the semiconductor lasers generally need to be wavelength stabilized (e.g., at 785 nm or other operating wavelengths, depending on the application).

In Raman applications, the most common technique for stabilizing the laser's operating wavelength is to use a diffraction grating in an external cavity geometry. This arrangement can be used to easily and inexpensively stabilize the laser's operating wavelength to a few inverse centimeter (e.g., $<50$ cm$^{-1}$). However, such an arrangement tends to be relatively temperature sensitive, i.e., temperature changes can cause thermal expansion of various elements of the assembly, which can in turn detune the alignment and change the laser's operating wavelength and/or vary the laser linewidth. As a result, a thermo-electric cooler (TEC) is commonly used to stabilize the laser's operating temperature to within a couple of degrees Celsius. However, thermo-electric coolers themselves consume substantial amounts of power, making such an arrangement undesirable in portable applications where power consumption is an important consideration.

As a result, in portable applications, it is common to use "uncooled lasers" (i.e., those lacking a thermo-electric cooler); however, these uncooled lasers are only operated over a relatively limited temperature range, in order to meet operating parameters of spectral purity and power consumption.

Thus, there is a need for a low-power, uncooled laser which can provide a stable, narrow-linewidth signal, over a wider operating temperature range.

SUMMARY OF THE INVENTION

This and other objects of the present invention are addressed by the provision and use of a novel uncooled external cavity laser capable of operating over an extended temperature range.

In one form of the invention, there is provided a laser package comprising:

a semiconductor laser having an operating temperature range; and a heater;

wherein the heater is configured to heat the laser when the laser package is positioned in an environment having an ambient temperature which lies outside of the operating temperature range of the laser, so that the laser will remain within the operating temperature range.

In another form of the invention, there is provided a laser package comprising:

a semiconductor laser having an operating temperature range, wherein the laser has differing operating efficiencies within the operating temperature range; and a heater;

wherein the heater is configured to heat the laser when the laser package is positioned in an environment having an ambient temperature which lies within the operating temperature range of the laser, but at a temperature which does not produce an optimal efficiency, so that the laser will operate at an increased efficiency.

In still another form of the invention, there is provided a laser package comprising:

a semiconductor laser having an operating temperature range, wherein the laser has differing operating efficiencies within the operating temperature range; and a heater;

wherein the heater is configured to operate in at least one of the following modes:

(i) when the laser package is positioned in an environment having an ambient temperature which lies outside of the operating temperature range of the laser, the heater operates so as to heat the laser to within the operating temperature range of the laser; and (ii) when the laser package is positioned in an environment having an ambient temperature which lies within the operating temperature range of the laser, but at a temperature which does not produce an optimal efficiency, the heater operates so as to heat the laser to a temperature at which the laser operates at an increased efficiency.

In still another form of the invention, there is provided a method for operating a semiconductor laser over an extended temperature range, comprising:

providing a semiconductor laser having an operating temperature range, and providing a heater;

operating the heater when the laser package is positioned in an environment having an ambient temperature which lies outside of the operating temperature range of the laser, so as to heat the laser to within the operating temperature range of the laser.

In still another form of the invention, there is provided a method for operating a semiconductor laser over an extended temperature range, comprising:

providing a semiconductor laser having an operating temperature range, wherein the laser has differing operating efficiencies within the operating temperature range, and providing a heater;

operating the heater when the laser package is positioned in an environment having an ambient temperature which lies within the operating temperature range of the laser, but at a temperature which does not produce an optimal efficiency, so as to heat the laser to a temperature at which the laser operates at an increased efficiency.

DESCRIPTION OF THE DRAWINGS

These and other objects and features of the present invention will be more fully disclosed or rendered obvious by the following detailed description of the preferred embodiments of the invention, which are to be considered together with the accompanying drawings wherein like numbers refer to like parts, and further wherein.

DETAILED DESCRIPTION OF THE PREFERRED EMBODIMENTS

Introduction

This invention relates to the application of external cavity lasers in spectroscopy, particularly for Raman spectroscopy where spectral purity and stable laser power are desirable. The present invention provides uncooled laser operation over an extended temperature range (e.g., from −30° C. to 60° C.), with sufficient output power and without calibration of laser wavelength. Such laser systems are particularly useful for portable and field-ready Raman instruments.

By way of example, the following Table 1 provides some key specifications that are generally necessary for 785 nm ECLs which are to be used in Raman spectroscopy:

TABLE 1

| Parameter | Unit | Min | Typical | Max |
|---|---|---|---|---|
| Power | mW | 375 | | |
| Temperature | ° C. | −30 | | 60 |
| Center Wavelength | nm | 784.5 | | 785.5 |
| 3 dB Linewidth | nm | | 0.12 | 0.18 |
| Center wavelength stability (on/off cold start) | nm | | | 0.03 |
| Center wavelength shift | nm | | 0.1 | 0.2 |
| SMSR (laser-gain peak) | dB | 20 | | |
| Total power consumption | W | | | 5 |

To this end, a semiconductor external cavity laser (ECL) laser structure was specially designed for uncooled operations at 785 nm at a temperature range of between −20° C. and 40° C. (with all other specifications as set out in the above Table 1). The performance of this semiconductor laser structure, including various modifications to permit use over an extended temperature range, will now be discussed.

Conventional Uncooled Laser Operation

Figure 1:
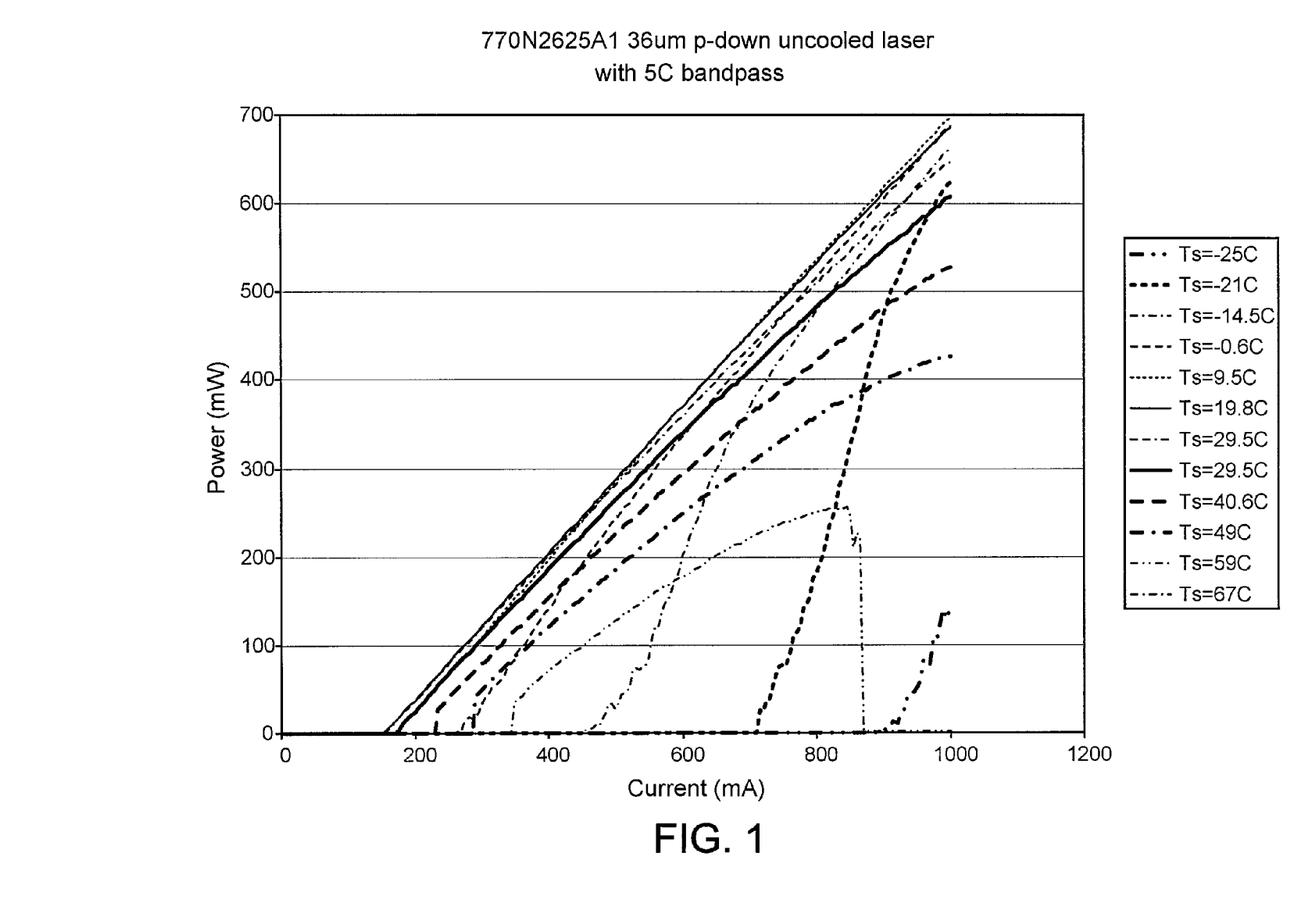
FIG. 1 is a schematic view showing uncooled laser temperature performance, plotting power versus current, for various laser operating temperatures.

FIG. 1 shows the laser intensity (LI) curve (i.e., plotting power versus current) for various laser operating temperatures. In essence, FIG. 1 shows that the LI curve generally rises with laser temperature—in other words, as the laser temperature increases, less current is required in order to initiate optical output, and a given level of current yields a higher level of optical output.

Figure 2:
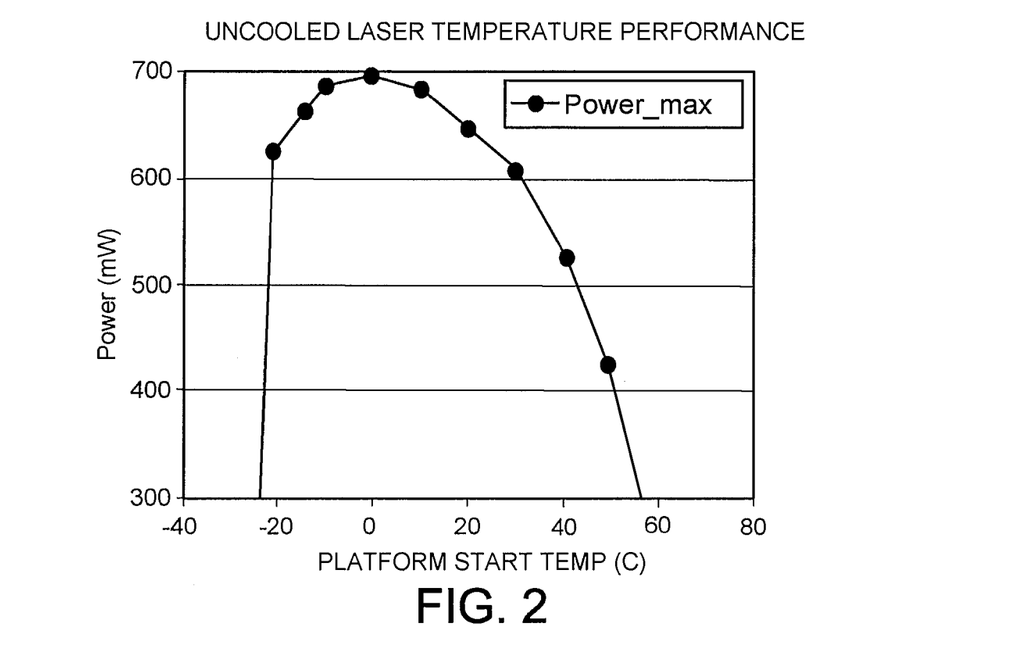
FIG. 2 is a schematic view showing uncooled laser temperature performance, plotting power versus platform start temperature.
Figure 3:
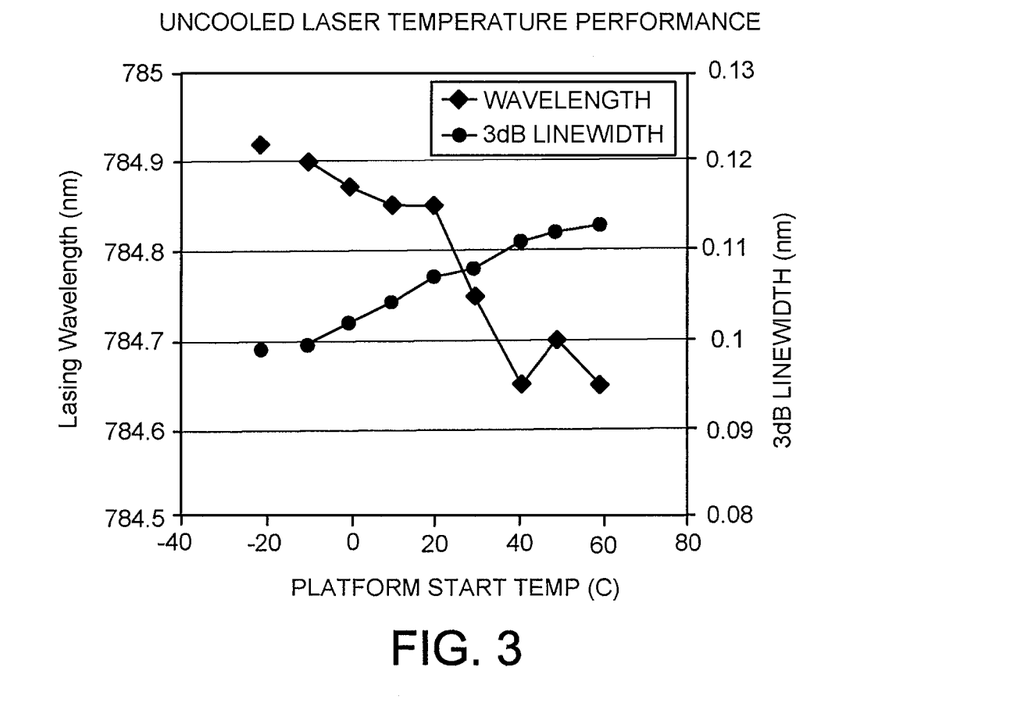
FIG. 3 is a schematic view showing uncooled laser temperature performance, plotting laser wavelength versus platform start temperature.

FIGS. 2 and 3 show additional performance characteristics for an uncooled external cavity laser (ECL). More particularly, FIG. 2 shows that the laser can meet all of the desired performance criteria while operating between −20° C. and 50° C. The operating current approaches (or equals) 1 A, with a bias of ~2.2 V, across the operative temperature range. Therefore, the total power consumption of the laser is ~2.2 W.

FIG. 3 shows wavelength and linewidth changes in the laser output across the operative temperature range. By manipulating the thermal properties of the laser chip sub-mount, the laser lens and the wavelength-stabilizing diffraction grating, one can minimize changes in the laser's output wavelength which may be caused by mechanical deformations in the system components and/or by temperature changes in the system components. See, for example, pending prior U.S. patent application Ser. No. 11/119,076, filed Apr. 29, 2005 by Daryoosh Vakhshoori et al. for EXTERNAL CAVITY WAVELENGTH STABILIZED RAMAN LASERS INSENSITIVE TO TEMPERATURE AND/OR EXTERNAL MECHANICAL STRESSES, AND RAMAN ANALYZER UTILIZING THE SAME, which patent application is hereby incorporated herein by reference.

Figure 6:
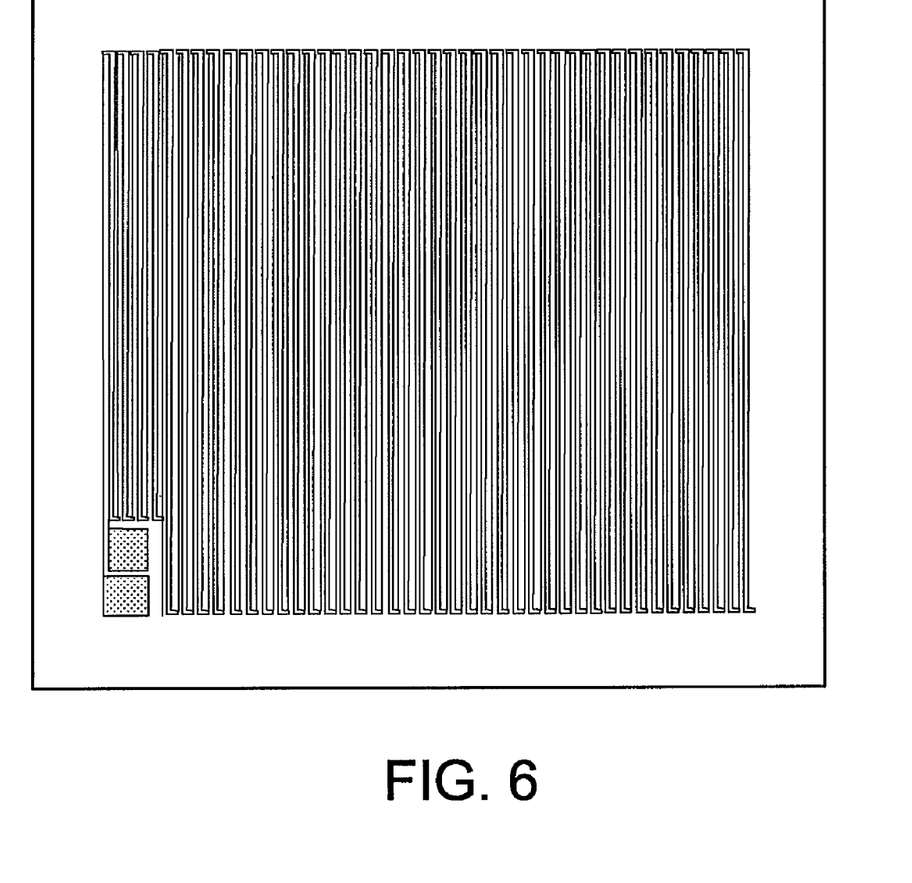
FIG. 6 is a schematic view showing a 2 W Pt heater.

Looking first at FIG. 6, there is shown an external cavity wavelength stabilized laser system 3 which exemplifies the typical geometry for an external cavity wavelength stabilized laser system. In this geometry, the wavelength of a laser 5 is set by the diffraction grating 10, by virtue of the diffraction feedback coming off the diffraction grating and back into the laser. A lens 15 is positioned between laser 5 and diffraction grating 10 in order to focus the light rays. The laser 5, the diffraction grating 10 and the lens 15 are all attached to a platform (or substrate) 20 by means of mounts 25, 30 and 35, respectively.

Figure 7:
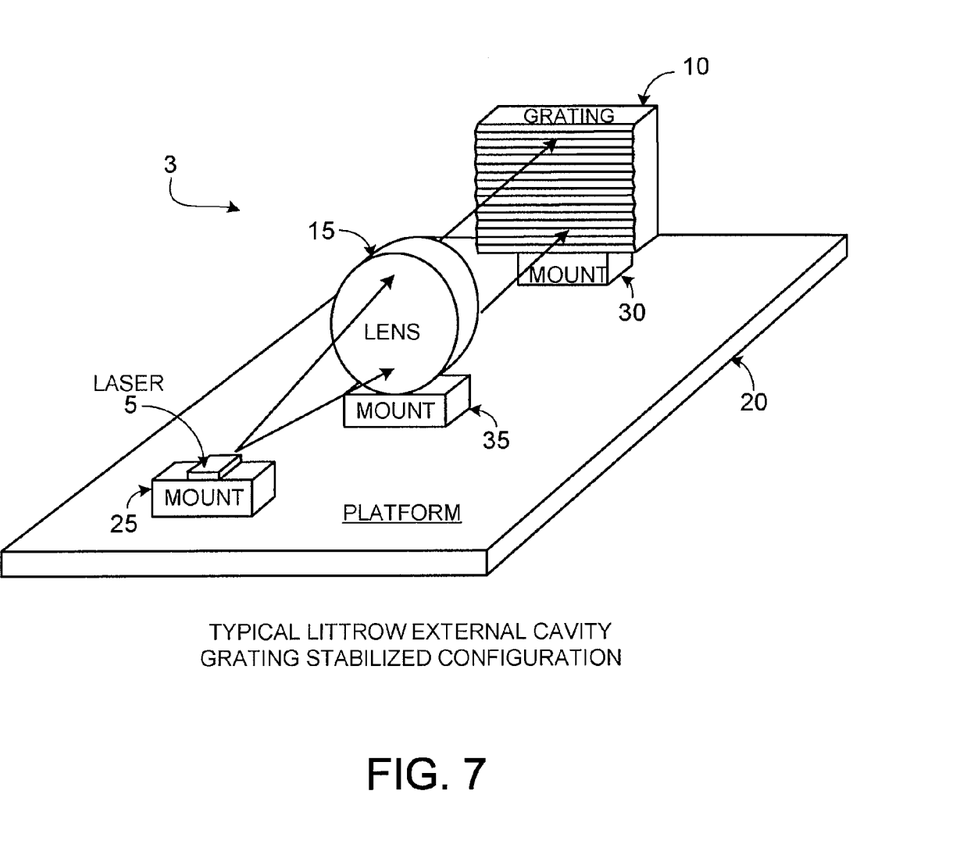
FIG. 7 is a schematic illustration showing a typical Littrow external cavity grating stabilized configuration.

More particularly, with the external cavity wavelength stabilized laser geometry shown in FIG. 7, the wavelength of the laser is set by the equation:

$$m\lambda G = \sin(\alpha) - \sin(\beta)$$

where "m" is the order of diffraction, "G" is the number of grating grooves per unit length, α is the angle of incidence on the grating, and β is the angle of diffraction from the grating. Lasing is established for the wavelength that allows the maximum diffraction hack to the laser. This condition of equality of α and β means that the laser wavelength is determined by the angle that the grating is forming with the collimated laser output. This type of external cavity laser geometry is commonly known as Littrow geometry, and the particular incident angle ($\alpha_L$) is commonly referred to as the Littrow angle.

$$m \cdot \lambda \cdot G = 2 \sin(\alpha_L) \rightarrow \lambda = 2 \cdot \sin(\alpha_L)/m \cdot G$$

This Littrow geometry is sensitive to temperature.

One effect of wavelength temperature sensitivity is through the change in the diffraction angle necessary to satisfy the condition of equality of (i) the incident angle of a beam coming from the laser and impinging on the grating, with (ii) the diffraction angle of a beam coming back to the laser emitting facet. Obviously differential temperature expansions of the laser mount 25, lens mount 35 and grating mount 30 can cause this angle to change, thus resulting in a shift of the laser wavelength.

Another effect of temperature on wavelength is through thermal expansion of the grating pitch density G. In other words, as the temperature of the diffraction grating changes, the pitch of the grating's grooves changes, thus leading to a shift of the laser wavelength.

In summary, then, with the Littrow geometry, changes in temperature tend to result in changes in wavelength due to two effects. The first is a change in the Littrow angle through differential temperature expansion of the laser mount, the lens mount and/or the grating mount, and/or the lens and laser material; and the second is the thermal expansion of the grating material itself which affects the grating pitch density G.

It has been discovered that temperature insensitive wavelength stabilization can be achieved by carefully balancing these two effects. More particularly, by carefully choosing the laser mount, the lens mount and the grating mount materials and their dimensions, as well as the lens material and its dimensions, the laser wavelength shift due to these net thermal expansions can effectively cancel the laser wavelength shift due to thermal changes in the grating pitch density G. In practice, we have applied this new technique in Raman laser assemblies operating at 785 nm wavelength to render the peak wavelength stable to within 0.02 nm from −10 degrees C. to +60 degrees C.

Figure 8:
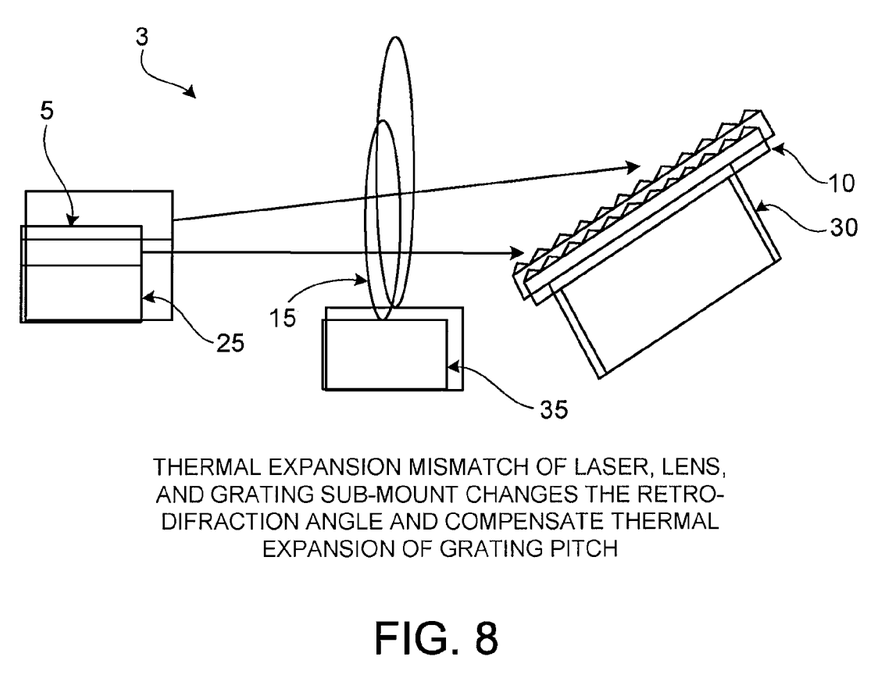
FIG. 8 is a schematic illustration showing a thermal expansion mismatch of laser, lens and grating mount changes in the retro-diffraction angle, and compensation of thermal expansion of the grating pitch.

One manifestation of this idea is schematically illustrated in the external cavity wavelength stabilized laser system 3 shown in FIG. 8. In essence, the present system uses differential changes in temperature expansions of the various system elements to change the Littrow angle, so as to cancel out temperature-induced changes in the pitch of the diffraction grating's grooves. As a result, the laser geometry is substantially insensitive to temperature changes because the thermal expansion of the laser mount 25, lens 15, lens mount 35 and grating mount 30 can compensate for the thermal expansion of the grating pitch.

Figure 9:
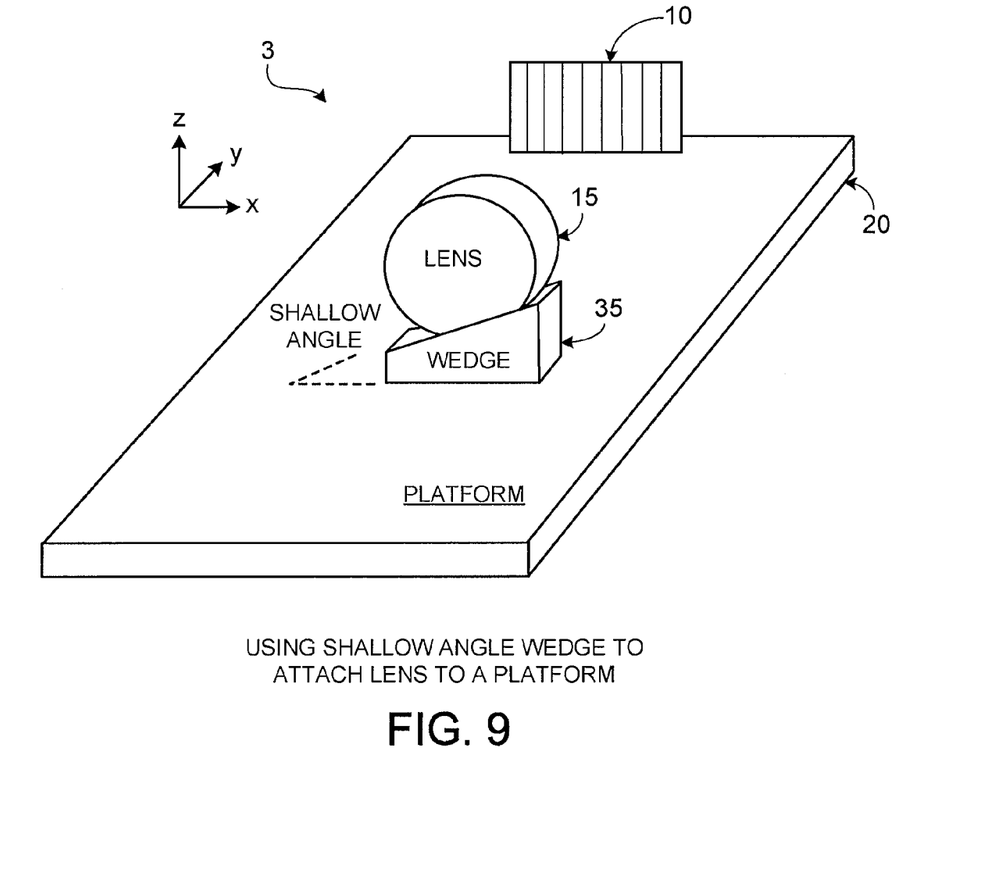
FIG. 9 is a schematic illustration showing a lens mount having a wedge configuration.

In another implementation, and looking now at FIG. 9, there is shown an external cavity wavelength stabilized laser system 3 wherein a wedge-shaped mount 35 is used to attach lens 15 to the platform 20. As a result of this construction, if the angle of the wedge is small (e.g., <45 degree), thermal expansion of the wedge will mainly induce a lens motion in the vertical direction (i.e., the z direction in FIG. 3). Thus, if the diffraction grating 10 is arranged so that its grooves extend parallel to this vertical direction, any beam redirection due to thermally-induced lens motions will have relatively little effect on the Littrow angle. Accordingly, in this form, a wedge-shaped lens mount 35 is coordinated with the direction of the diffraction grating's grooves so as to reduce the effect of thermally-induced lens movement on the Littrow angle and thus stabilize the wavelength of the laser.

As noted above, the effect of thermal expansion of the diffractor (e.g., diffraction grating 10) and the resulting change in the diffraction characteristics of the diffractor (e.g., the thermal expansion of the grating pitch density G) inducing a shift of the laser wavelength may effectively be counterbalanced by the differential temperature expansions of the laser mount 25, lens mount 35 and/or grating mount 30. In this respect, it should be appreciated that differential temperature expansions of the laser mount 25, lens mount 35 and grating mount 30 may also be used to effectively counterbalance (i.e., offset) effects other than a change in the diffraction characteristics of the diffractor. Thus, if the diffraction grating is substantially insensitive to temperature, it can still be important to counterbalance the various effects temperature expansion of the various elements so as to maintain the Littrow angle. By way of example but not limitation, if temperature expansion of the laser mount 25 causes a change in the incident angle of the diffractor, the lens mount 35 may be configured to counterbalance this change in the incident angle of the diffractor so as to maintain the Littrow angle. It should be noted that any one or more of laser mount 25, lens mount 35 or grating mount 30 may act as a counterbalancing element for a change in the incident angle of the diffractor caused by another element.

Figure 10:
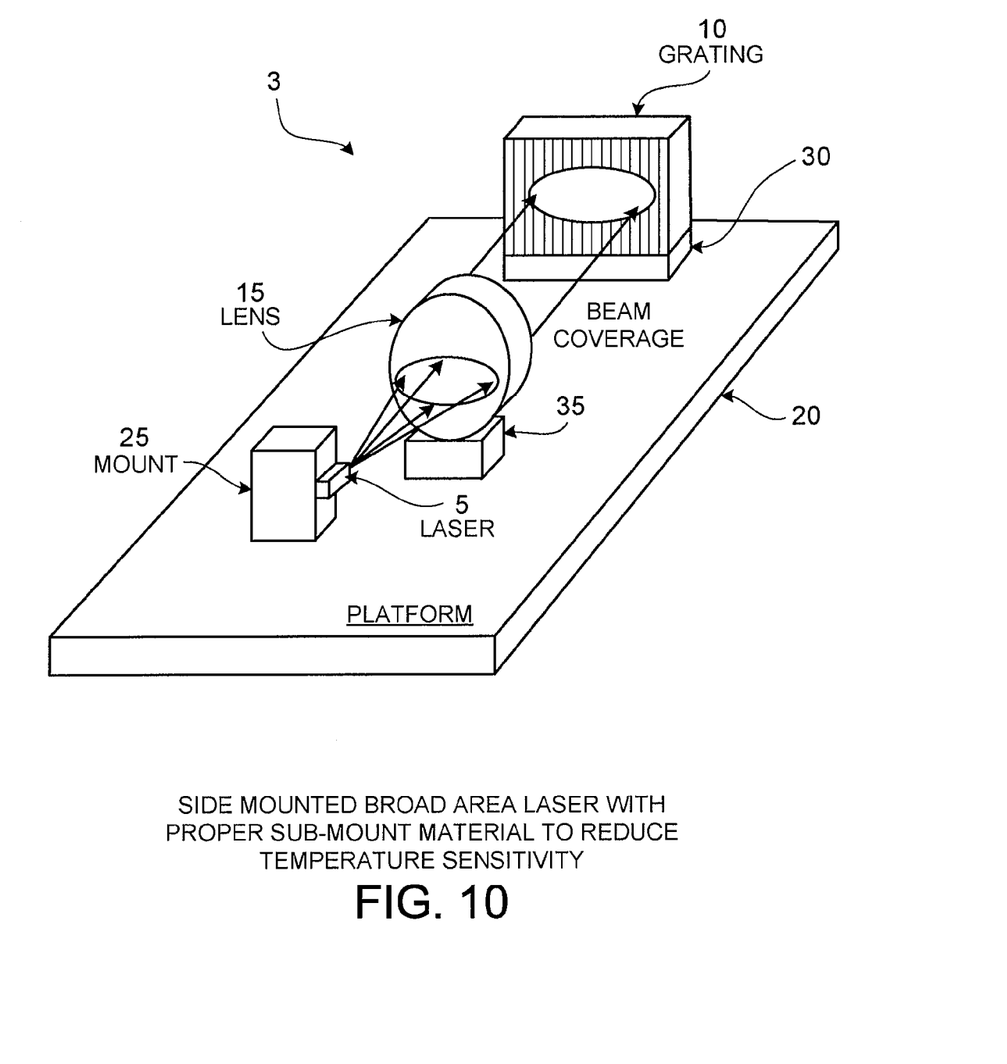
FIG. 10 is a schematic illustration showing a side mounted broad area laser with appropriate mount material so as to reduce temperature sensitivity.

Looking next at FIG. 10, there is shown another external cavity wavelength stabilized laser system 3. More particularly, to achieve high power laser operation (e.g., for use in Raman pump applications), wavelength stabilized broad area lasers are commonly used. Such lasers are commonly characterized by multiple transverse modes that have a single lateral mode operation. Although the techniques presented in this disclosure work well for single spatial mode lasers, their benefits are even more obvious for multiple transverse mode broad area lasers that have single lateral mode operation. Thus, and looking now at FIG. 10, if these broad area lasers 5 are mounted on their side such that the plane defined by the diverging angle of the lateral mode is parallel to the plane of the platform 20, and the grooves of the diffraction grating 10 extend perpendicular to the plane of the platform, the laser wavelength becomes relatively insensitive to to the vertical displacement of the laser mount 25, lens mount 35, and grating mount 30, and the vertical displacement of the laser chip 5 and lens 15. Of course, the grating pitch density may still change with temperature, thus effecting laser wavelength. However, by properly choosing the material of the laser mount 25 so that it will cancel the effect of the grating pitch density change on wavelength, a temperature-insensitive operation can be achieved. With the side-mounted geometry shown in FIG. 10, a laser mount material can be chosen so as to cancel the grating pitch density change effect on laser wavelength for a relatively large temperature range. In practice, this technique has been applied to a broad area laser emitting more than 500 mW at 785 nm to achieve less than 0.02 nm wavelength shift for a temperature range from −10 degrees C. to +60 degrees C., by using copper as the laser mount material with standard grating material.

Figure 11:
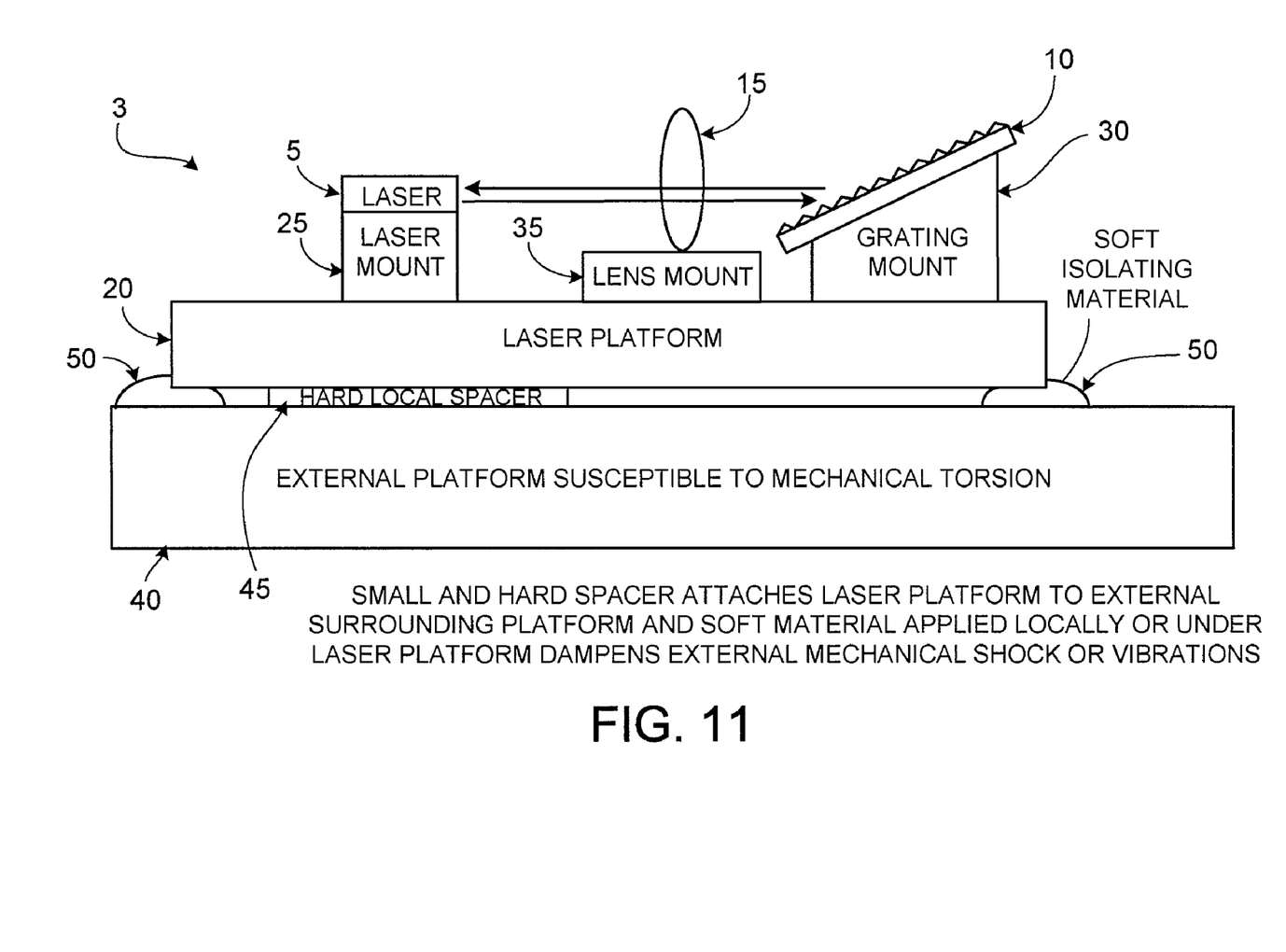
FIG. 11 shows a novel means for mounting the laser platform to an external surrounding platform so as to reduce the effect mechanical deformations and distortions.

Looking next at FIG. 11, there is shown another external cavity wavelength stabilized laser system 3. More particularly, if the laser platform 20 mechanically deforms due to external stress (either temperature or mechanicanically induced), misalignment of the system components can occur, resulting in a change of the Littrow angle and thus affecting the external cavity laser wavelength. To this end, the laser platform 20 can be, to at least some extent, mechanically isolated from the outside (e.g., from the external platform 40) by using a relatively small, thin, hard local spacer 45 and segments of soft isolating material 50. The hard local spacer 45 provides relatively rigid mechanical attachment to the outside world through the externally supplied platform 40 (i.e., chassis) and can be thermally conductive so as to heat-sink the laser 5 (in which case the spacer 45 is preferably attached directly beneath the laser mount 25). The segments of soft isolating material 50 serve as shock/vibration absorbers to dampen external forces, and may comprise epoxy or similar materials. Thus, in this aspect of the invention, the laser platform 20 is attached to an external platform 40 via (i) a small, hard and potentially thermally conductive spacer 45, and (ii) segments of soft material 50, so as to reduce the effect of mechanical deformations and distortions on the wavelength of the external cavity laser.

Although discussed in the context of an external cavity grating stabilized laser, the concepts also apply to thin-film wavelength stabilized lasers.

Figure 12:
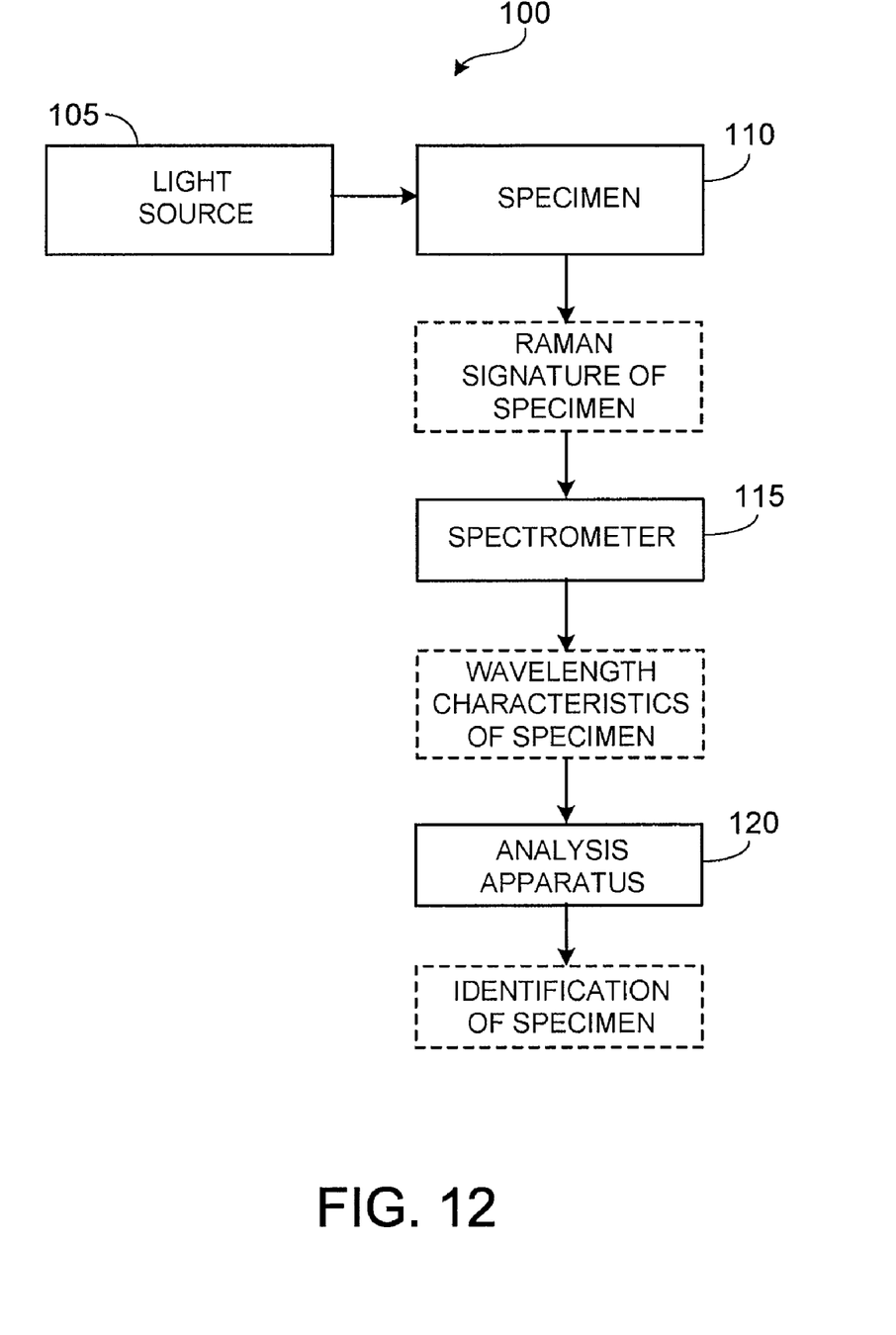
FIG. 12 is a schematic view showing a novel Raman analyzer.

It is possible to utilize the novel external cavity temperature stabilized laser in many applications. It is particularly useful a portable applications requiring stable, narrow-linewidth light signals. Thus, for example, in FIG. 12 there is shown novel Raman analyzer 100. Raman analyzer 100 generally comprises a light source 105 for delivering excitation light to a specimen 110 so as to generate the Raman signature for that specimen, a spectrometer 115 for receiving the Raman signature of the specimen and determining the wavelength characteristics of that Raman signature, and analysis apparatus 120 for receiving the wavelength information from spectrometer 115 and, using the same, identifying specimen 110. Light source 105 comprises an uncooled, external cavity wavelength stabilized laser formed in accordance with the present invention. By way of example, light source 105 may comprise a laser system such as that shown in FIGS. 7-11. By virtue of the fact that the Raman analyzer 100 utilizes the uncooled, external cavity wavelength stabilized laser system of the present invention, the entire Raman analyzer can be made more power efficient, which is a significant advantage in handheld applications.

However, the conventional, low-power, uncooled laser still needs to operate over a relatively limited temperature range in order to provide a stable, narrow-linewidth signal. Thus, there is the need for a new approach which will enable a low-power, uncooled laser to operate over a wider temperature range while still providing a stable, narrow-linewidth signal.

Operation in Extended Temperature Range (E.g., from −30° C. to 60° C.)

(i) Heater to Enable Operation Across a Lower Temperature Range

In a first form of the present invention, the operating temperature range of the system is extended in the lower temperature range by incorporating a heater into the laser package. This heater is not designed to stabilize the operating temperature of the laser in an absolute sense—as a result, the heater-enhanced laser system is still considered to be an "uncooled laser". However, the addition of the heater to the laser package permits the system to be used in ambient environments which fall outside the laser's operating temperature range. In accordance with the present invention, when the ambient temperature falls below the laser's operating temperature range, the heater is used to heat the laser package so as to keep the laser within the laser's operating temperature range.

Furthermore, by providing a heater in the laser package, the temperature of the laser can be increased as desired. This can be useful even when the temperature of the laser falls within the laser's operating temperature range. In this form of the invention, the heater is used so as to operate the laser with greater efficiency (i.e., in the context of FIG. 2, the heater is operated so as to shift operation of the laser from one LI curve to another LI curve). This can be done even where the laser is in an ambient environment which falls within the laser's operating temperature range (but where the laser is at a temperature which is less than optimally efficient).

Thus, by using a heater to increase the laser's operating temperature range, power consumption can be reduced while keeping the desired spectral purity.

In addition to the foregoing, the heater can be incorporated into the platform so as to ensure wavelength insensitivity over the temperature range. The laser gain peak should also be adjusted by +3 nm, e.g., from 783 nm to 786 nm as measured at 20° C. The heater material can be nichrome, platinum or other materials.

By adjusting the gain peak, adequate performance of the laser can be expected from −10° C. to 60° C. Thus, for an ambient temperatures of below −10° C., the heater should be turned on so as to maintain a minimum temperature of −10° C. on the platform. Furthermore, for ambient temperatures of between −10° C. to 60° C., the heater can be turned on so as to ensure optimal operation.

Figure 4:
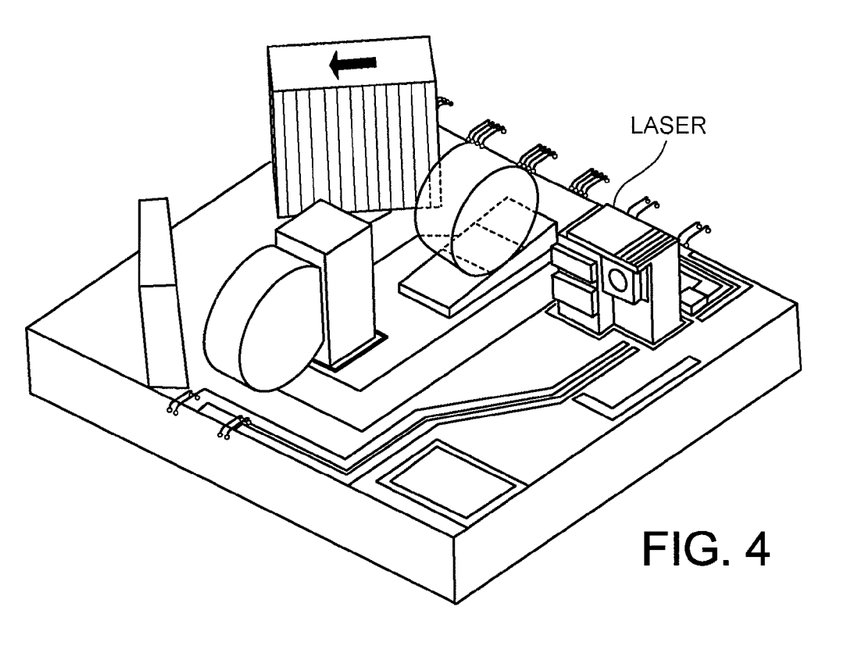
FIG. 4 is a schematic top view of an external cavity laser (ECL) with a platinum (Pt) heater mounted on the top side of an aluminum nitride (AlN) platform.
Figure 5:
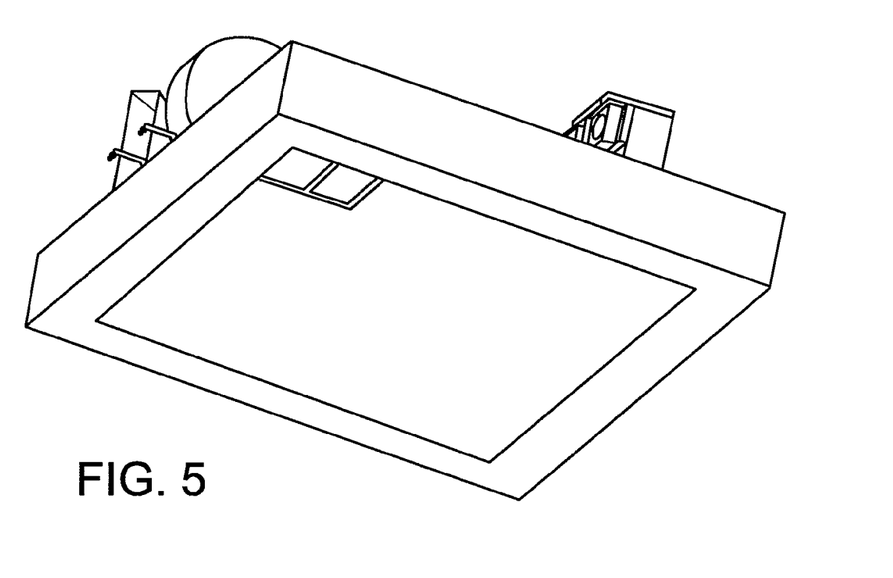
FIG. 5 is a schematic bottom view of a structure similar to that shown in FIG. 4, except that the Pt heater is mounted on the back side of the AlN platform.

Various designs for incorporating a heater on the platform are shown in FIGS. 4-6. FIG. 4 is a top view of an external cavity laser (ECL) with an aluminum nitride (AlN) platform. Note the heater, the temperature sensor and on-board logic circuitry for controlling operation of the heater. FIG. 5 is the same platform, but with a back-mounted platinum (Pt) heater. FIG. 6 is a 2 W platinum (Pt) heater design.

If desired, a more powerful heater can be used to reduce the initial set-up time, i.e., the time required to achieve the desired change in temperature ($\Delta T$).

In another embodiment of the present invention, a local heater may be placed adjacent to the laser chip, (or directly on the laser chip) so as to further reduce the power consumption of the laser package. By way of example, for a p-down, die-bonded laser chip, the heater can be lithographically added on the back metal contacts of the laser chip. This design can be advantageous, since it effectively maintains the current footprint of the laser chip. Where the heater is placed directly on the laser chip, 1 W local heater is adequate to change the laser chip temperature by 20° C. The estimated wavelength shift is ~−0.1 nm over the 20° C. temperature change ($\Delta T$). However, some wavelength calibration may be necessary for laser operation at the lower temperatures of −30° C. to −10° C.

(ii) Semi-Uncooled Laser Operation

In this new design, a thermo-electric cooler (TEC) is incorporated in the laser package just as is done with a conventional, "cooled" laser package. However, the TEC is only operated to maintain a $\Delta T=0°$ C. throughout the operating range of the laser. For a typical TEC the maximum power consumption is <0.5 W at T=50° C. for a 2.2 W heat load. This results in total power consumption of <2.7 W. However, in the low temperature range of −30° C. to −10° C., the TEC should act as a heater. The estimated heat power consumption at −30° C. is ±2 W, with a total power consumption of <4.2 W.

Further Constructions

It is to be understood that the present invention is by no means limited to the particular constructions herein disclosed and/or shown in the drawings, but also comprises any modifications or equivalents within the scope of the invention.

What is claimed is:

1. A laser package comprising:
a laser system comprising:
a platform;
a semiconductor laser supported on the platform by a laser sub-mount;
a lens supported on platform; and
a diffractor supported on the platform;
wherein the laser system has an operating temperature range within which compensating changes in position and thermal properties of the laser sub-mount, the lens, and the diffractor due to changes of temperature of the laser package stabilize an output wavelength of the laser package; and
a temperature controller;
wherein the temperature controller is configured with at least the following operating modes:
(i) when the laser package is positioned in an environment having an ambient temperature which lies outside of the operating temperature range of the laser system, the temperature controller operates so as to heat or cool the laser system to within the operating temperature range of the laser system.

2. The laser package of claim 1 wherein the semiconductor laser is an external cavity laser.

3. The laser package of claim 1 wherein the temperature controller comprises platinum.

4. The laser package of claim 1 wherein the temperature controller comprises nichrome.

5. The laser package of claim 1 wherein the laser system's operating temperature range is between −30° C. to 60° C.

6. The laser package of claim 1 wherein the temperature controller is mounted on the platform.

7. The laser package of claim 6 wherein the platform comprises aluminum nitride.

8. The laser package of claim 6 wherein the temperature controller is mounted to a top of the platform.

9. The laser package of claim 6 wherein the temperature controller is mounted to a bottom of the platform.

10. The laser package of claim 6 wherein the temperature controller is mounted on the platform adjacent to the semiconductor laser.

11. The laser package of claim 1 wherein the temperature controller is mounted on the semiconductor laser.

12. A method for operating a semiconductor laser over an extended temperature range, comprising:
providing a temperature controller;
assembling a laser package comprising a semiconductor laser supported on a platform by a laser chip sub-mount, a lens supported on the platform, and a diffractor supported on the platform;
stabilizing an output wavelength of the laser package as a temperature of the laser package changes by compensating changes in position and thermal properties of the laser chip sub-mount, the lens, and the diffractor;
operating the temperature controller when the laser package is positioned in an environment having an ambient temperature which lies outside an operating temperature range of the laser to heat or cool the laser system to within the operating temperature range of the laser system.

13. An apparatus comprising:
a portable Raman analyzer comprising:
a light source configured to deliver light to a specimen;
a spectrometer configured to receive a Raman signature from the specimen and determine wavelength characteristics of the Raman signature; and
an analysis apparatus configured to identify a specimen based on wavelength characteristics of the Raman signature received from the spectrometer;
wherein the light source is a laser package comprising:
a laser system comprising:
a platform;
a semiconductor laser supported on the platform by a laser sub-mount;
"a lens supported on the platform; a diffractor supported on the platform;"
wherein the laser system is configured such that compensating changes in position and thermal properties of the laser sub-mount, the lens, and diffractor due to changes of temperature of the laser package within an operating temperature range of the laser system stabilize an output wavelength of the laser system;
a temperature controller; and
logic circuitry configured to control operation of the temperature controller to, when the laser package is positioned in an environment having an ambient temperature which lies outside of the operating temperature range of the laser system, heat or cool the laser system to within the operating temperature range of the laser system.

14. The apparatus of claim 13 wherein the semiconductor laser is an external cavity laser.

15. The apparatus of claim 13 wherein the temperature controller of the laser package is mounted on the platform of the laser package.

16. The apparatus of according to claim 15 wherein the temperature controller is mounted to a top of the platform of the laser package.

17. The apparatus of according to claim 15 wherein the temperature controller is mounted to a bottom of the platform of the laser package.

18. The apparatus of according to claim 15 wherein the temperature controller is mounted on the platform of the laser package adjacent to the semiconductor laser.

19. The apparatus of according to claim 13 wherein the temperature controller is mounted on the semiconductor laser.

20. The laser package of claim 1, wherein the semiconductor laser has an operating temperature range within which the semiconductor laser has differing operating efficiencies.

21. The laser package of claim 20, wherein the temperature controller is configured with at least the following additional operating mode:
(ii) when the laser package is positioned in an environment having an ambient temperature which lies within the operating temperature range of the laser system, but at a temperature which does not produce an optimal efficiency of the semiconductor laser, the temperature controller operates so as to heat or cool the semiconductor laser to a temperature at which the semiconductor laser operates at an increased efficiency.

22. The laser package of claim 1, wherein system components including the semiconductor laser, a laser mount, the diffractor, a diffractor mount, the lens, and a lens mount are configured so that (i) a change in the angle of incidence of the light on the diffractor due to a change in the temperature of the system components substantially offsets (ii) a change in the diffraction characteristics of the diffractor due to the change in the temperature of the system components.

23. The laser package of claim 1, wherein the temperature controller is a thermo-electric cooler.

24. The laser package of claim 1, wherein the diffractor is optically coupled to the lens and the laser.

* * * * *